Figure 1:
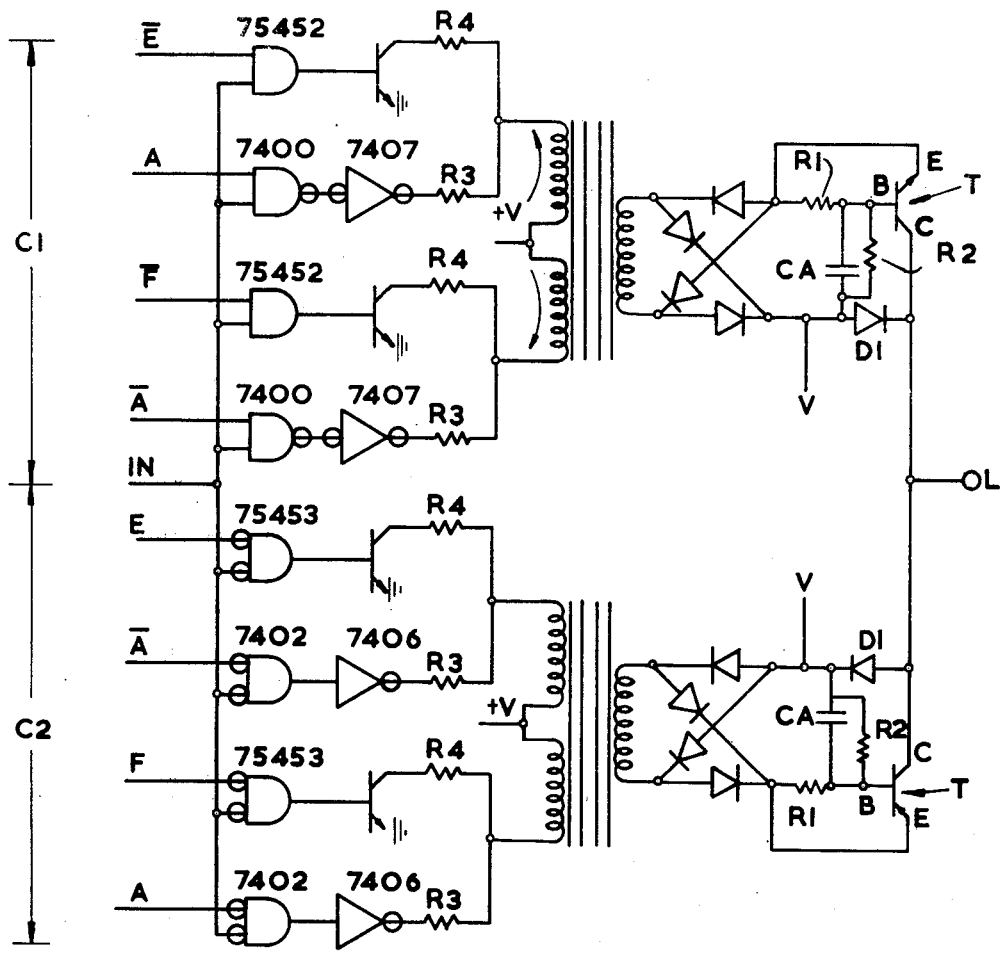

United States Patent [19]

Lewis

[11] 4,075,511
[45] Feb. 21, 1978

[54] ELECTRONIC SWITCHES

[75] Inventor: John Didwith Lewis, Braintree, England

[73] Assignee: Imperial Chemical Industries Limited, London, England

[21] Appl. No.: 678,425

[22] Filed: Apr. 19, 1976

[30] Foreign Application Priority Data

Apr. 18, 1975 United Kingdom ............... 16083/75
July 22, 1975 United Kingdom ............... 30657/75

[51] Int. Cl.$^2$ ........................................... H03K 17/00
[52] U.S. Cl. .................................. 307/270; 307/254; 307/300
[58] Field of Search ............... 307/270, 254, 300, 237, 307/314

[56] References Cited

U.S. PATENT DOCUMENTS

| 3,133,208 | 5/1964 | Lentz | 307/300 |
| 3,471,720 | 10/1969 | Radnor | 307/314 |
| 3,868,517 | 2/1975 | Schoeff | 307/270 |

FOREIGN PATENT DOCUMENTS 907,361 10/1962 United Kingdom ................ 307/300

Primary Examiner—Stanley D. Miller, Jr.
Assistant Examiner—B. P. Davis
Attorney, Agent, or Firm—Cushman, Darby & Cushman

[57] ABSTRACT

This invention relates to electronic switches for driving a load, for example, a capacitive load. Specifically, the switch of the invention includes means for producing a first pulsed current of a certain value and for a period of time sufficient to charge the capacitive load, means for producing a second holding current sufficient to supply leakage current to the load, the input having one side thereof connected in circuit with a reference voltage to which it is required to switch the load and having the other side thereof connected to the emitter of a transistor, with the base of the transistor driven from a potential divider disposed across the input and with the collector of the transistor connected to the capacitive load, and a diode connected between the collector of the transistor and the reference voltage so that when the transistor conducts, current is drawn from or fed to the load until the output voltage is higher than the reference, whereupon the output is clamped by the current flowing through the diode.

5 Claims, 2 Drawing Figures

ELECTRONIC SWITCHES

This invention relates to electronic switches and, more particularly, to high voltage switches.

According to one aspect of the invention there is provided an electronic switch for driving a load comprising means for producing a d.c. voltage input of a certain value to actuate the switch, a potential divider connected across the d.c. input, a diode and a transistor with the collector thereof connected in circuit with the diode which is connected in circuit with one side of the input, with the emitter of the transistor connected in circuit with the other side of the input via a resistor and with the output of the potential divider connected in circuit with the base of the transistor, means for applying a reference voltage at a position between the diode and the appropriate side of the input so that, in operation, switching of the transistor by the input connects the load to the reference voltage, so that when the transistor conducts, current is drawn from or fed to the load until the output voltage is higher than the reference voltage, whereupon the output is clamped by the current flowing in the diode.

Preferably that part of the potential divider connecting the reference voltage to the transistor base has a speed-up capacitor in parallel. In more detail and in operation, when it is required to actuate the switch, a voltage is arranged to drive the input thereby causing the transistor to switch on as current flows into the base principally via the resistor and capacitor (functioning as a speed-up capacitor) which are connected in parallel. The collector of the transistor therefore draws current and the output voltage rises until, at a sufficiently high voltage, the diode connected in circuit between the reference voltage and the collector, passes current with the majority of the current from the input flowing through the diode and transistor. This clamps the voltage applied to, for example, the capacitive load within a small voltage (that is, the voltage across the diode when conducting) considered in relation to the reference voltage.

As the speed-up capacitor charges up the current in the transistor falls. In this condition, when the lower current part of the cycle starts, output switching will be complete and the small current flowing serves to hold the output steady. Since the base of the transistor is fed from the potential divider, the transistor will not saturate, because if the collector-emitter voltage across the transistor falls, the base emitter voltage falls, turning off the transistor so that collector-emitter voltage rises again. Further, because the transistor is not saturated and has only a relatively small collector current, when the input voltage is removed, the transistor will quickly switch off.

According to a further aspect of the invention, the d.c. input may be obtained from a pulse transformer or a bridge rectifier circuit may be introduced between the transformer secondary winding and the remaining circuitry of the switch with the primary of the transformer driven from a succession of pulses.

According to another aspect of the invention there is provided an electronic switch for driving a load comprising means for producing a first pulsed d.c. input current of a certain value and for a period of time sufficient to charge or energise the load, means for producing a second holding current sufficient to supply leakage current to the load, the input having one side thereof connected in circuit with a reference voltage to which it is required to switch the load and having the other side thereof connected to the emitter of a transistor, with the base of the transistor driven from a potential divider disposed across the input and with the collector of the transistor connected to the load, and a diode connected between the collector of the transistor and a reference voltage so that, in operation, when the transistor conducts, current is drawn from or fed to the load until the output voltage is higher than the reference voltage, whereupon the output is clamped by the current flowing in the diode.

In more detail and in operation, the collector of the transistor draws current and the output voltage rises until, at a sufficiently high voltage, the diode connected in circuit between the reference voltage and the collector, passes current with the majority of the current from the transformer flowing through the diode and transistor. This clamps the voltage applied to, for example, the capacitive load within a small voltage (that is, the voltage across the diode when conducting) considered in relation to the reference voltage. When the lower current part of the cycle starts, output switching will be complete and the small current flowing serves to hold the output steady. Since the base of the transistor is fed from the potential divider, the transistor will not saturate, because if the collector-emitter voltage across the transistor falls, the diode causes the voltage across the potential divider to fall so that the base emitter voltage falls, turning off the transistor so that collector-emitter voltage rises again. Further, because the transistor is not saturated and has only a relatively small collector current, when the current input ceases, the transistor will quickly switch off.

According to a further aspect of the invention, the d.c. input may be obtained from a pulse transformer.

In certain circumstances, it may be desirable to hold the voltage applied via the switch to the capacitive load for an indefinite time yet still to use a transformer for isolation. In another aspect of the invention, therefore, a bridge rectifier or full wave rectifier is provided between the secondary of the transformer and its load and means are provided for producing a first high current pulse of period greater than one half of that required to charge the capacitor followed by a second high current pulse, in the opposite sense and of similar period to the first pulse, followed by a series of bi-directional holding pulses obtained from an oscillator and of similar duration to the said first and second pulses.

This series of bi-directional holding pulses is continued for a period equal to that for which it is required to hold the capacitive load at the reference voltage. If the reference voltage changes in such a sense that the current in the diode is reduced, the two first high current pulses must be repeated in order to charge the capacitor to the new voltage.

According to a preferred embodiment of the invention two switch circuits as described above but of opposite polarity are used, each being driven in the opposite sense, so that the capacitive load may be charged by one circuit and discharged by the other circuit.

High voltage switches using transformer isolated circuits described have the advantages that the output side of each individual circuit is isolated from the circuitry which is associated with the primary side of the transformer.

A further advantage of the switch circuitry according to the invention in that, because after the speed-up capacitor has charged the transistors are not saturated, they switch-off more quickly than would otherwise be the case. This advantage is particularly useful when high voltage transistors are used because fast saturated switching devices are not readily available.

Another advantage of the switch circuitry of the invention is that it can be short circuit-proof because the output current magnitude is determined by the circuitry.

Two forms of high voltage switch for driving a capacitive load in accordance with the invention will now be described by way of example with reference to the accompanying circuit diagrams, namely, FIG. 1 and FIG. 2.

Each circuit diagram includes two similar high voltage switch circuits C1 and C2 connected to drive the capacitive load in the opposite senses so that the capacitive load is charged by one circuit and discharged by the other circuit or charged to a different level. In other words, the load is driven positively by one circuit and negatively by the other circuit.

Figure 2:
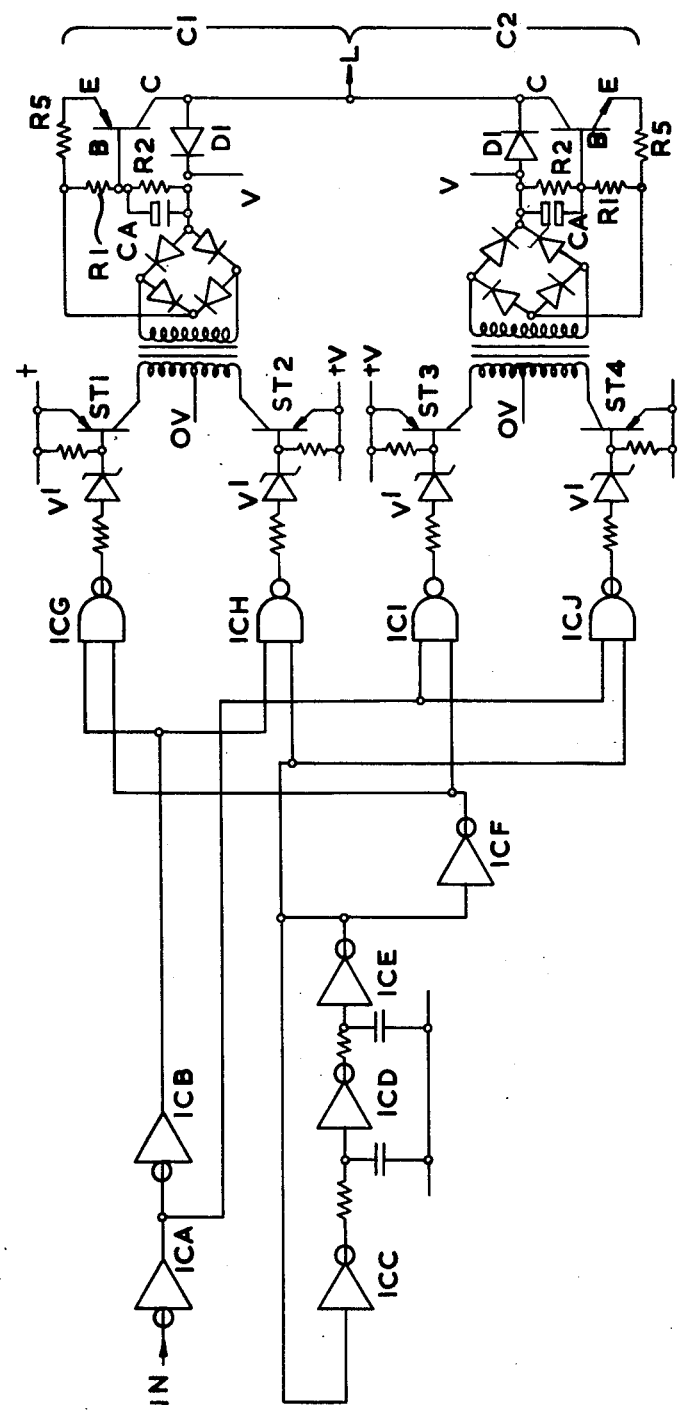

In each of FIGS. 1 and 2, each of the two circuits C1 and C2 consists of a transformer coupled push-pull circuit with a divided primary winding driven by 75450 and 7400 series (in the case of FIG. 1) and simply 7400 circuits in the case of FIG. 2, as detailed in the Texas Instruments Semiconductor Data Books 1 and 2 (published by Texas Instruments Ltd.) and PNP switching transistors. The secondary side of the transformer is in both Figures connected via a bridge rectifier to a potential divider, R1, R2, capacitor CA, diode D1, transistor T netowork as shown and having a connection to a reference voltage V. A capacitive load L is connected to the collectors of thw two transistors T of the circuits C1 and C2.

Referring specifically to FIG. 1, assuming an input applied via In is high, the outputs from the 75452, and 7407 drivers are low when enabled by high individual input pulsed supply signals applied via $\overline{E}$, $\overline{F}$, A, and $\overline{A}$. When In goes high, input signals $\overline{E}$ and A are made high, current is caused to flow through one of the primary windings of the transformer, the current being limited by resistors R3 and R4. After a predetermined time depending upon the timing of input signals received from an external timing source (e.g. a master timing device), $\overline{E}$ and A are caused to go low and $\overline{F}$ and $\overline{A}$ are caused to go high. In this condition gates associated with the remaining 75452 and 7407 drivers cause current to flow through the other primary winding of the transformer which current is again limited by the appropriate R3 and R4 resistors. Again, after a predetermined time, only the 7400 gate connected to A is enabled and the current through the associated primary winding is reduced to a value which is limited by R3. Similarly and again, after a further predetermined time, the 7400 gate connected to $\overline{A}$ is enabled. The A and $\overline{A}$ pulses are repeated for as long as the switches are to be held on. Thus, a pair of comparatively high current pulses are fed to the transformer primary, followed by a succession of lower current pulses. The circuitry associated with the secondary side of the transformer thus receives an input of square wave form, rectifies it and uses it to drive the emitter E of the transistor T—preferably a high voltage transistor designated MPS A42. The transistor is, therefore, caused to switch on as the current flows into the transistor base B through the resistor R2 and capacitor CA. The collector of the transistor draws current and the output voltage thereof rises and is fed to the diode D which when a predetermined voltage level is reached, conducts. The majority of the current from the transformer now flows through the diode D1 and the transistor, and the reference voltage drives the capacitive load L. When the lower current part of the input square wave form commences, the output switching will be complete and the relatively small current then flowing serves to hold the output steady.

Assuming an input applied to In is low, the outputs from the 75452 and 7406 drivers are low when enabled by low individual input signals applied to E, F, A and $\overline{A}$.

When In goes low input signals E and $\overline{A}$ are made low, current is caused to flow through one of the primary windings of the transformer, the current being limited by resistors R3 and R4. After a predetermined time depending upon the timing of input signals received from an external timing source (e.g. a master timing device), E and $\overline{A}$ are caused to go high and F and A are caused to go low. In this condition, gates associated with the remaining 75453, and 7406 drivers cause current to flow through the other primary winding of the transformer which current is again limited by the appropriate R3 and R4 resistors.

Again, after a predetermined time, only the 7402 gate connected to $\overline{A}$ is enabled and the current through the associated primary winding is reduced to a value which is limited by R3. Similarly and again, after a further predetermined time, the 7402 gate connected to A is enabled. The A and $\overline{A}$ pulses are repeated for as long as the switch is to be held on. Thus, a pair of comparatively high current pulses are fed to the transformer primary, followed by a succession of lower current pulses. The circuitry associated with the secondary side of the transformer thus receives an input of square wave form, rectifies it, and uses it to drive the emitter E of the transistor T—preferably a high voltage transistor designated MPS A92.

The transistor is therefore caused to switch on as the current flows into the transistor base B through the resistor R2 and capacitor CA.

The collector of the transistor draws current and the output voltage rises until at a predetermined level, the diode D1 conducts. The majority of the current from the transformer now flows through the diode D1 and the transistor, and the output voltage to drive the capacitive load is held at the reference voltage, plus the clamp voltage of the diode D. When the lower current part of the input square wave form commences, the output switching will be complete and the relatively small current then flowing serves to hold the output steady.

A bank of switches in accordance with this invention may be used as electrode drive circuits in a pattern printing apparatus described and claimed in our prior British Pat. No. 1,354,890. Briefly, one embodiment of pattern printing apparatus described in British Pat. No. 1,354,890 comprises a number of rows of printing guns extending the full width of the material to be printed. The guns in each row are connected to a common manifold with the manifolds of each row supplied with a differently coloured printing ink under pressure so that all the guns in each row print the same colour. Each gun comprises a nozzle through which the ink is passed under pressure to form a jet of ink which, under suitable vibrations produced by a piezo-electric crystal in the manifold, is broken up into a stream of drops.

Each jet of ink passes through a charge electrode of tubular form and the charge electrode is positioned at that point where each jet of ink is broken up or separated into drops.

The charge electrode forms together with the stream of drops and nozzle, which is connected to earth, a capacitor which can be charged to different potentials by the application of different voltage levels so that each drop in the stream of drops receives an appropriate charge.

Each stream of drops then passes between two deflector electrodes which are maintained at a substantially constant potential difference. As each drop passes through the deflector electrodes it is deflected in a transverse direction (i.e. along the line of the row of printing guns) to an amount depending on its charge. These drops which have been charged to a charge corresponding to a first voltage level (i.e. gutter voltage level for drops which are not required for printing) are collected in a drop intercepting device or gutter and can then be recirculated in the apparatus while the remaining drops which have received a charge corresponding to one of a series of second voltage levels are deposited on the material being printed.

Corresponding guns from the multiple rows of guns comprise a group of guns and of the drops simultaneously produced by each group of guns, only one drop is charged for deposition on the material to be printed, the remaining drops being charged for deposition in the gutter.

Thus, all but one of the charge electrodes in each groups of guns have applied to them the first voltage level whilst the remaining charge electrode has applied to it one of the series of second voltage levels.

The multiple rows of printing guns are conveniently arranged in an arcuate assembly so that the drops produced by all the rows alight on the same transverse line section on the material being printed.

Since each sequence of drops produced by a gun during each period of the voltage wave form (if charged for deposition on the material) has to alight in a different place, the second voltage levels applied to the charge electrode have likewise to be different and this is achieved by using a staircase wave form having the requisite number of different levels. Since the voltage fields between successive pairs of deflector plates are in opposite senses, in order that deflection of the drops occurs in the correct direction, the second voltage levels applied to adjacent groups of charge electrodes are of equal magnitude but opposite sign. The first voltage level may be, for example, zero (i.e. there is no deliberate charging of these drops which are to go to the gutter) or it can be a positive or negative level outside the range of second voltage levels and the first or second voltage levels are applied to the charge electrodes using electrode drive circuits which includes high voltage switches in accordance with the present invention.

In FIG. 2, the input side of the switch circuit differs from that of FIG. 1 by the inclusiong of six Schmitt, integrated circuit triggers ICA, ICB, ICC, ICD, ICE and ICF connected as indicated to provide double inputs to the four 7400 series circuits designated ICG, ICH, ICI and ICJ which drive the transformers via zener diodes V' and switching transistors ST1, ST2, ST3 and ST4. The circuitry associated with diodes D1 and capacitors CA in FIG. 2, compared with FIG. 1, is modified to include a further resistor R5.

Assuming that the input applied to In goes high, the output from ICA goes low to disable ICI and ICJ and the output from ICB goes high to drive inputs to ICG and ICH. ICC, ICD, ICE and the resistor capacitor networks form a phase shift oscillator and in conjunction with ICF provide approximately square wave signals 180° out of phase to ICG and ICH (so that ICG and ICH outputs are low alternately). These outputs drive the bases of two switching transistors ST1 and ST2 via resistor and zener diode networks so that the transistors switch a 10 volt square wave across the transformer primary.

The circuitry associated with the secondary side of the transformer thus receives a 5 volt square wave form, rectifies it and uses it to drive the emitter E of the transistor T—preferably a high voltage transistor designated MJE 340. The transistor is therefore caused to switch on as the current flows into the transistor base B through the resistor R2 and capacitor CA. The collector of the transistor draws current and the output voltage thereof rises and is fed to the diode D1 which, when a predetermined voltage level is reached, conducts. The majority of the current from the transformer now flows through the diode D1 and the transistor, and the reference voltage drives the load L. When the capacitor CA is fully charged, the output switching will be complete and the relatively small current then flowing serves to hold the output steady.

When In goes low, the output from ICA goes high and from ICB goes low to disable gates ICG and ICH. Inputs to ICI and ICJ are driven by ICA and by the square wave signals from the phase shift oscillator and ICF (so that ICI and ICJ outputs are low alternately). These outputs drive the bases of two switching transistors ST3 and ST4 via resistor and zener diode networks so that the transistors switch a 10 volt square wave across the transformer primary.

The circuitry associated with the secondary side of the transformer thus receives a 5 volt square wave form, rectifies it, and uses it to drive the emitter E of the transistor T—preferably a high voltage transistor designated MJE 350. The transistor is therefore caused to switch on as the current flows into the transistor base B through the resistor R2 and capacitor CA.

The collector of the transistor draws current and the output voltage rises until at a predetermined level, the diode D1 conducts. The majority of the current from the transformer now flows through the diode D1 and the transistor, and the output voltage to drive the capacitive load is held at the reference voltage, plus the clamp voltage of the diode D. When the capacitor CA is fully charged, the output switching will be complete and the relatively small current then flowing serves to hold the output steady.

This type of switch may be used as drive for a telegraph line signalling converter, converting low voltage (say 5 volt) signals to +80/−80 volt signals to drive a telegraph line.

What I claim is:

1. An electronic switch for driving a load comprising: an input, means for producing a first pulsed d.c. input current of a certain value and for a period of time sufficient to permit current flow through the load and applying said pulsed current to said input, second means for producing a second holding current sufficient to supply leakage current to the load and applying said second holding current to said input, the said input having one side thereof connected to a reference voltage to which it is required to switch the load and having the other side thereof connected to the emitter of a transistor, with the base of the transistor driven from a potential divider disposed across the input and with the collector of the transistor connected to the load, and a diode connected between the collector of the transistor and the reference voltage so that, in operation, when the transistor conducts, current passes through the load until the output voltage is higher than the reference voltage, whereupon the output is clamped by the current flowing in the diode.

2. A switch according to claim 1, wherein the input is via a pulse transformer.

3. A switch according to claim 1, wherein that part of the potential divider connecting the reference voltage to the transistor base has a speed-up capacitor in parallel.

4. A switch according to claim 1, incorporating a transformer and including a bridge or full-wave rectifier connected between the secondary of the transformer and the load and means are provided for producing, in the primary of the transformer, a first high current pulse of period greater than one half of that required to overcome any capacitance in the load followed by a second high current pulse, in the opposite sense and of similar period to the first pulse, followed by a series of bi-directional holding pulses obtained from an oscillator and of similar duration to the said first and second pulses.

5. A circuit including two switches as claimed in claim 1 wherein each switch is of opposite polarity so that the load is energised by one switch and de-energised by the other switch.

* * * * *